(12) United States Patent
Chao et al.

(10) Patent No.: US 10,333,095 B1
(45) Date of Patent: Jun. 25, 2019

(54) ORGANIC ELECTROLUMINESCENCE DEVICE AND ITS ORGANIC ELECTROLUMINESCENCE COMPONENT

(71) Applicants: Ching-Yan Chao, Hsinchu (TW); Feng-Wen Yen, Hsinchu (TW)

(72) Inventors: Ching-Yan Chao, Hsinchu (TW); Feng-Wen Yen, Hsinchu (TW)

( * ) Notice: Subject to any disclaimer, the term of this patent is extended or adjusted under 35 U.S.C. 154(b) by 0 days.

(21) Appl. No.: 16/151,345

(22) Filed: Oct. 4, 2018

(30) Foreign Application Priority Data

Mar. 1, 2018 (TW) .............................. 107106861 A

(51) Int. Cl.
*H01L 51/52* (2006.01)
*H05B 33/08* (2006.01)

(52) U.S. Cl.
CPC ...... *H01L 51/5209* (2013.01); *H01L 51/5225* (2013.01); *H05B 33/0896* (2013.01); *H01L 2251/5361* (2013.01)

(58) Field of Classification Search
CPC ............ H01L 27/3239; H01L 51/5209; H01L 51/5225; H01L 2251/5361
See application file for complete search history.

(56) References Cited

U.S. PATENT DOCUMENTS 9,655,198 B2 * 5/2017 Krummacher ...... H01L 51/5203

* cited by examiner

*Primary Examiner* — Tung X Le
*Assistant Examiner* — Henry Luong

(57) ABSTRACT

An organic electroluminescence component includes a substrate, a first electrode layer, an organic material layer, a second electrode layer and a first electrical connection portion. The organic material layer is located between the second electrode layer and the first electrode layer. A common overlapping region of the second electrode layer, the organic material layer and at least one part of the first electrode layer defines a light-emitting region. The shape of the part of the first electrode layer has a first end and a second end which are opposite to each other and unequal in impedance. The first electrical connection portion is electrically connected to the first electrode layer, and located opposite to the second end of the shape.

10 Claims, 7 Drawing Sheets

ORGANIC ELECTROLUMINESCENCE DEVICE AND ITS ORGANIC ELECTROLUMINESCENCE COMPONENT

CROSS-REFERENCE TO RELATED APPLICATIONS

This application claims the benefit of priority of TW Patent Application Ser. No. 107106861 filed on Mar. 1, 2018, the content of which is incorporated herein by reference in its entirety.

FIELD OF INVENTION

The present disclosure relates to an organic electroluminescence component. More particularly, the present disclosure relates to an organic electroluminescence component that can provide a gradient-brightness surface and an organic electroluminescence device using the organic electroluminescence component.

BACKGROUND OF THE INVENTION

An organic electroluminescence component is formed by two electrodes and an organic material layer sandwiched between the two electrodes. By applying a proper voltage onto the organic electroluminescence component, the organic material layer is excited to emit light. The organic electroluminescence component has the characteristics of thinness, lightness, high luminous efficiency, high color rendering, etc., and can be fabricated on a glass substrate or a flexible plastic substrate, so it is suitable for use in the field of illumination to replace the general illumination source.

In general, an organic electroluminescence component as an illumination source focuses on emitting light uniformly and stably. However, the focus of such an illumination source on the uniform illumination is inevitably causing monotonous and lack of variation, and needs to be further improved.

Therefore, how to develop a solution to improve the above-mentioned lack and inconvenience is an important issue in the organic electroluminescent lighting industry.

SUMMARY OF THE INVENTION

An embodiment of the present disclosure is to provide an organic electroluminescence component. The organic electroluminescence component includes a substrate, a first electrode layer, an organic material layer, a second electrode layer and a first electrical connection portion. The first electrode layer is located on the substrate. The second electrode layer is located on the substrate. The organic material layer is located between the second electrode layer and the first electrode layer, and a common overlapping region of the second electrode layer, the organic material layer and at least one part of the first electrode layer defines a light-emitting region. The at least one part of the first electrode layer has a shape having a first end and a second end opposite to each other, and the first electrode layer has different impedances at the first end and the second end of the shape, respectively. The first electrical connection portion is electrically connected to one end of the first electrode layer, and located opposite to the second end of the shape of the first electrode layer.

According to one or more embodiments of the present disclosure, in the aforementioned organic electroluminescence component, the light-emitting region is defined by a common overlapping region of the second electrode layer, the organic material layer and the entire first electrode layer, and the shape is the entire contour of the first electrode layer.

According to one or more embodiments of the present disclosure, the aforementioned organic electroluminescence component further includes an isolation layer. The isolation layer is stacked between the organic material layer and the first electrode layer. The isolation layer includes at least one opening. The at least one part of the first electrode layer is completely exposed from the at least one opening, and the organic material layer is connected to the at least one part of the first electrode layer through the at least one opening.

According to one or more embodiments of the present disclosure, in the aforementioned organic electroluminescence component, the first end of the aforementioned shape is less than the second end of the aforementioned shape in width.

According to one or more embodiments of the present disclosure, the aforementioned organic electroluminescence component further includes a second electrical connection portion. The second electrical connection portion is electrically connected to the other end of the first electrode layer, and is located opposite to the first electrical connection portion. The width of the end where the first electrode layer is electrically connected to the first electrical connection portion is not larger than the length of the first electrical connection portion, and the width of the other end at which the first electrode layer is electrically connected to the second electrical connection portion is not larger than the length of the second electrical connection portion.

According to one or more embodiments of the present disclosure, the aforementioned organic electroluminescence component further includes a changeover switch. The changeover switch is electrically connected to the first electrical connection portion and the second electrical connection portion, in order to use a power unit to selectively switch on the first electrical connection portion and/or the second electrical connection portion.

According to one or more embodiments of the present disclosure, when the changeover switch only switches on the first electrical connection portion and the power unit applies a voltage to the first electrode layer and the second electrode layer, a gradient-brightness surface is generated in the light-emitting region. The gradient-brightness surface gradually decreases its brightness step by step in a direction from the first end to the second end, and the brightness percentage of the gradient-brightness surface ranges from 100% to 10%. When the changeover switch only switches on the second electrical connection portion and the power unit applies a voltage to the first electrode layer and the second electrode layer, a gradient-brightness surface is generated in the light-emitting region. The gradient-brightness surface gradually decreases its brightness step by step in a direction from the second end to the first end, and the brightness percentage of the gradient-brightness surface ranges from 100% to 50%.

According to one or more embodiments of the present disclosure, in the aforementioned organic electroluminescence component, the aforementioned shape has a line symmetric shape. The symmetric axis of the line symmetric shape is parallel with the long axis direction of the first electrode layer.

According to one or more embodiments of the present disclosure, in the aforementioned organic electroluminescence component, the shape gradually increases in width in the direction from the first end to the second end.

According to one or more embodiments of the present disclosure, in the aforementioned organic electroluminescence component, the aforementioned shape is one of, or approximates to, a triangle, trapezoid, sector, and pentagon.

Another embodiment of the present disclosure is to provide an organic electroluminescence device. The organic electroluminescence device includes a power unit and at least two organic electroluminescence components. Each of the organic electroluminescence components includes a substrate, a first electrode layer, an organic material layer, a second electrode layer, a first electrical connection portion, a second electrical connection portion, and a changeover switch. The first electrode layer is located on the substrate. The second electrode layer is located on the substrate. The organic material layer is located between the second electrode layer and the first electrode layer, and a common overlapping region of the second electrode layer, the organic material layer and at least one part of the first electrode layer defines a light-emitting region. The at least one part of the first electrode layer has a shape having a first end and a second end opposite to each other, and the first electrode layer has different impedances at the first end and the second end of the shape, respectively. The first electrical connection portion is electrically connected to one end of the first electrode layer, and located opposite to the second end of the shape of the first electrode layer. The second electrical connection portion is electrically connected to the other end of the first electrode layer, and located opposite to the first electrical connection portion. The changeover switch is electrically connected to the first electrical connection portion and the second electrical connection portion, and is used to enable the power unit to selectively switch on the first electrical connection portion and/or the second electrical connection portion. The power unit is electrically connected to the changeover switch and the second electrode layer of each organic electroluminescence component, in order to independently control these organic electroluminescence components for different light-emitting requirements.

According to one or more embodiments of the present disclosure, in the aforementioned organic electroluminescence device, a gradient-brightness surface and a uniform-brightness surface are generated in these light-emitting regions of these organic electroluminescence components, respectively.

According to one or more embodiments of the present disclosure, the aforementioned organic electroluminescence device is a decorative lamp or a direction indication lamp.

In this way, through the demonstration of the aforementioned embodiments, the organic electroluminescence device can provide a light-emitting surface gradually changing its brightness step by step, so as to improve the application flexibility of OLED in the lighting field, and in turn improve the user preference.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

In order to achieve the aforementioned and other purposes, features, and advantages, and make the embodiments of the present disclosure more clearly understood, the accompanying drawings are illustrated as below.

DESCRIPTION OF THE PREFERRED EMBODIMENTS

Figure 1:
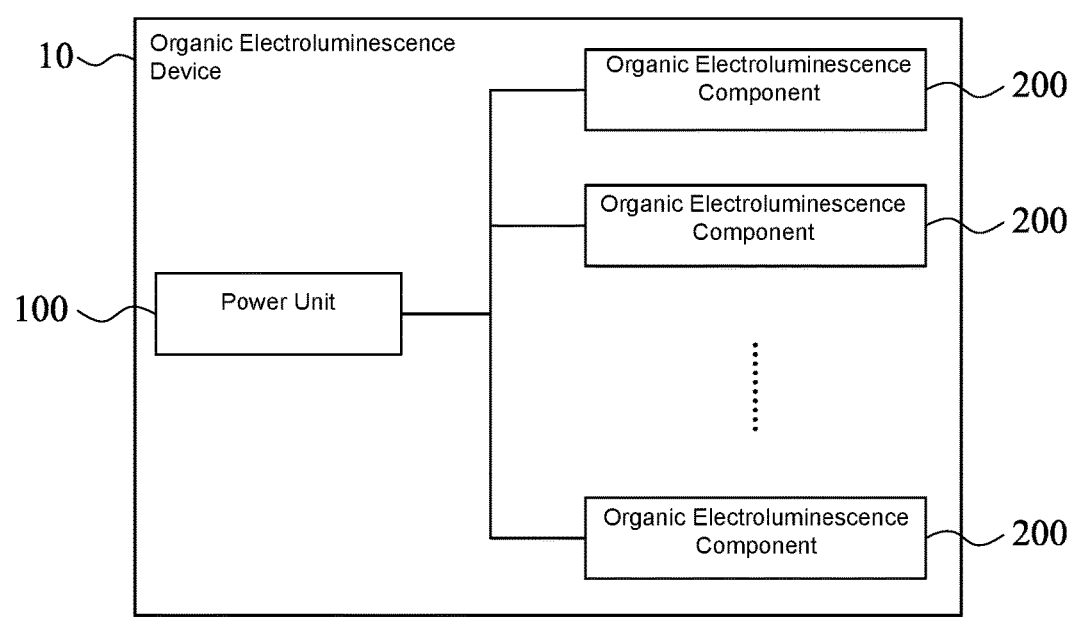
FIG. 1 is an electronic block diagram of an organic electroluminescence device according to one embodiment of the present disclosure.

Plural embodiments of the present disclosure are disclosed through drawings. For the purpose of clear illustration, many practical details will be illustrated along with the description below. It should be understood that, however, these practical details should not limit the present disclosure. In other words, in embodiments of the present disclosure, these practical details are not necessary. In addition, for the purpose of simplifying the drawings, some conventional structures and components are simply and schematically depicted in the figures.

It is to be understood that although particular phrases used herein, such as "first", "second", "third", and so on, are used to describe different components, members, regions, layers, and/or sections, these components, members, regions, layers, and/or sections should not be limited by these terms. These phrases are used to distinguish one component, member, region, layer, or section from another component, member, region, layer, or section. In this way, a first component, member, region, layer, and/or section to be described below may be referred to as a second component, member, region, layer, and/or section, without departing from the spirit and scope of the present disclosure.

Spatially relative phrases, such as "under", "below", "underlying", "beneath", "on", "above", and so on used herein, are used for facilitating description of a relation between one component or feature and another component or feature depicted in the drawings. Therefore, it can be understood that, in addition to directions depicted in the drawings, the spatially relative terms mean to include all different orientations during usage or operations of the device. For example, it is assumed that a device in a figure is reversed upside down, a component described as being "under", "below", or "beneath" another component or feature is oriented "on" the other component or feature. Therefore, these exemplary terms "under" and "below" may include orientations above and below. The device may be otherwise oriented (e.g., turned by 90 degrees, or other orientations), and the spatially relative terms used herein should be explained accordingly.

Accordingly, it may be understood that when a component or a layer is referred to as being "on" or "connected to", or "coupled to" another component or another layer, it may be immediately on the other component or layer, or connected to or coupled to the other component or layer, or there may be one or more intermediate components or intermediate layers. Further, it can be understood that when a component or a layer is referred to as being "between" two components or two layers, it may be the only component or layer between the two components or layers, or there may be one or more intermediate components or intermediate layers.

Terminologies used herein are only for the purpose of describing particular embodiments, but not limiting the present disclosure. The singular form of "a" and "the" used herein may also include the plural form, unless otherwise indicated in the context. Accordingly, it can be understood that when there terms "include" or "comprise" are used in the specification, it clearly illustrates the existence of a specified feature, bulk, step, operation, component, and/or member, while not excluding the existence or addition of one or more features, bulks, steps, operations, components, members and/or groups thereof. "And/or" used herein includes any and all combinations of one or more related terms that are listed. When a leading word, such as "at least one of", is added ahead of a component list, it is to describe the entire component list, but not individual components among the list.

Reference is now made to FIG. 1, which is an electronic block diagram of the organic electroluminescence device 10 according to one embodiment of the present disclosure. As shown in FIG. 1, the organic electroluminescence device 10 includes a plurality of (e.g., two or more) organic electroluminescence components 200 and a power unit 100. The power unit 100 electrically connects these organic electroluminescence components 200, respectively, and independently controls whether these organic electroluminescence components 200 emit light or not.

Figure 2A:
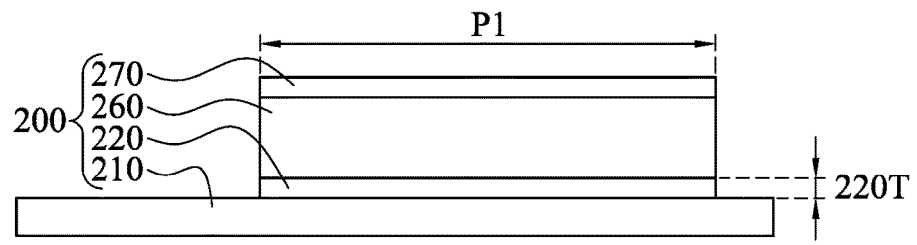
FIG. 2A is a sectional view of the organic electroluminescence component of FIG. 1.
Figure 2B:
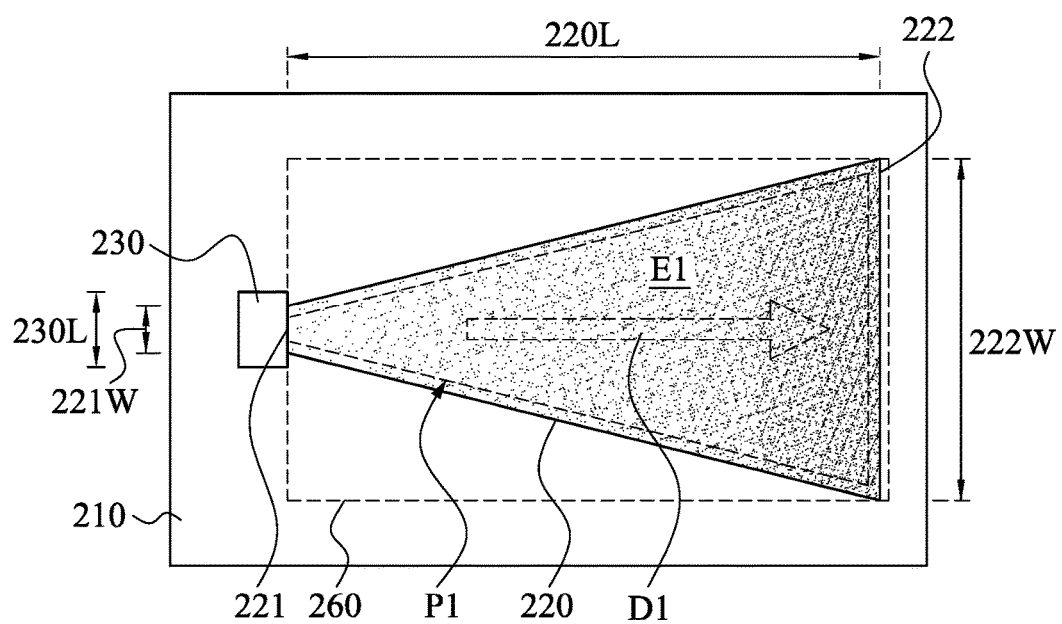
FIG. 2B is a schematic luminescence diagram of an organic electroluminescence component comprising the first electrode layer of FIG. 2A.

FIG. 2A is a sectional view of the organic electroluminescence component 200 of FIG. 1, and FIG. 2B is a schematic luminescence diagram of the organic electroluminescence component 200. As shown in FIG. 2A and FIG. 2B, each organic electroluminescence component 200 includes the substrate 210, the first electrode layer 220, the organic material layer 260, and the second electrode layer 270. The first electrode layer 220 is located on the substrate 210. The organic material layer 260 is located on the first electrode layer 220. The second electrode layer 270 is located on the organic material layer 260, and the organic material layer 260 is located between the second electrode layer 270 and the first electrode layer 220. The common overlapping region of the second electrode layer 270, the organic material layer 260 and the first electrode layer 220 defines the light-emitting region P1. For example, the first electrode layer 220 is an anode electrode, and the second electrode layer 270 is a cathode electrode. As shown in FIG. 1 and FIG. 2A, the power unit 100 is electrically connected to the first electrode layer 220 and the second electrode layer 270 of each organic electroluminescence component 200 to independently apply a voltage to the first electrode layer 220 and the second electrode layer 270 so that the organic material layer 260 can emit lights upon excitation.

In the embodiment, the aforementioned light-emitting region P1 is defined by the common overlapping region of the second electrode layer 270, the organic material layer 260 and the entire first electrode layer 220. The shape of the orthographic projection from the entire first electrode layer 220 to the substrate 210 (i.e., the entire contour of the first electrode layer 220) is provided with a first end 221 and a second end 222 opposite to the first end 221, and the long axis direction of the first electrode layer 220 (referring to D1) goes through both of the first end 221 and the second end 222.

The first end 221 and the second end 222 of the first electrode layer 220 are located opposite to each other, and the first end 221 differs from the second end 222 in impedance. In the embodiment, the width 221W of the first end 221 of the first electrode layer 220 is less than the width 222W of the second end 222. For example, the width 222W of the second end 222 of the first electrode layer 220 may be twice to 100 times of the width 221W of the first end 221. However, the above are merely examples and are not intended to be limitations of the invention.

More specifically, the length 220L of the first electrode layer 220 is 30 mm-300 mm, and the thickness 220T of the first electrode layer 220 is 50 nm-200 nm. However, the above is merely an example and is not intended to be a limitation of the present invention.

In addition, each organic electroluminescence component 200 further includes a first electrical connection portion 230. The first electrical connection portion 230 is electrically connected to the first end 221 of the first electrode layer 220, and located opposite to the second end 222. In the embodiment, the width 221W of the first end 221 of the first electrode layer 220 is not larger than the length 230L of the first electrical connection portion 230. In the embodiment, for example, the length 230L of the first electrical connection portion 230 is 5 mm-100 mm. However, the present disclosure is not limited to this range. Under other requirements or limitations, the width 221W of the first end 221 of the first electrode layer 220 may also be equal to the length of the first electrical connection portion 230.

Thus, in the embodiment, when the power unit 100 inputs current to the first electrode layer 220 through the first electrical connection portion 230 only, but not through an additional secondary electrode (e.g., a bus bar), because the width 221W of the first end 221 of the first electrode layer 220 is less than the width 222W of the second end 222 of the first electrode layer 220, the first end 221 of the first electrode layer 220 is larger than the second end 222 of the first electrode layer 220 in impedance. As a result, when the current goes through the first electrode layer 220 in the direction from the first end 221 to the second end 222, because of higher resistance and more concentrated current on the side of the first end 221, the voltage on the side of the first end 221 is higher than that on the side of the second end 222 in the organic electroluminescence component 200. The voltage of the organic electroluminescence component 200 gradually decreased in the direction D1, thus generating the first gradient-brightness surface E1 in the light-emitting region P1. The first gradient-brightness surface E1 gradually decreases its brightness step by step in the direction D1 from the first end 221 to the second end 222.

In the embodiment, because the entire contour of the first electrode layer 220 of the organic electroluminescence component 200 is, or approximates to, a trapezoid, the organic electroluminescence component 200 may provide the first gradient-brightness surface E1 with a trapezoidal shape upon excitation.

In addition, although the entire contour of the first electrode layer 220 mentioned in the embodiment is a trapezoid, the shape of the first electrode layer 220 is not limit to any particular shape, such as a triangle, a sector, a pentagon, or any non-geometrical shape, as long as the width 221W of the first end 221 of the first electrode layer 220 is less than the width 222W of the second end 222, and the width gradually increases in the direction D1 from the first end 221 to the second end 222. Moreover, although the entire contour of the first electrode layer 220 has a line symmetric shape and the symmetric axis of the line symmetric shape is parallel with the long axis of the first electrode layer 220, the entire contour of the first electrode layer 220 is not limit to the line symmetric shape.

Moreover, in the embodiment, the substrate 210 is, but not limited to, a light-transmitting substrate, for example, a glass, sapphire, or plastic substrate, etc. However, the substrate 210 described in the present disclosure is not limited to being rigid or flexible. The development of the organic material layer 260 is relatively mature in the organic electroluminescence field, so the material of the organic material layer 260 is not limited in the present disclosure. The first electrode layer 220 is a light-transmitting electrode of which the material is, for example, indium tin oxide (ITO), indium zinc oxide (IZO), or aluminum zinc oxide (AZO), or any combinations thereof. The second electrode layer 270 is a reflective electrode of which the material is aluminum (Al), silver (Ag), Magnesium (Mg), Calcium (Ca), or Lithium (Li), or any combinations thereof. However, the second electrode layer 270 may also be made of thin metal materials or light-transmitting electrode material, enabling the second electrode to transmit light to additionally provide a double-sided display effect.

Figure 3A:
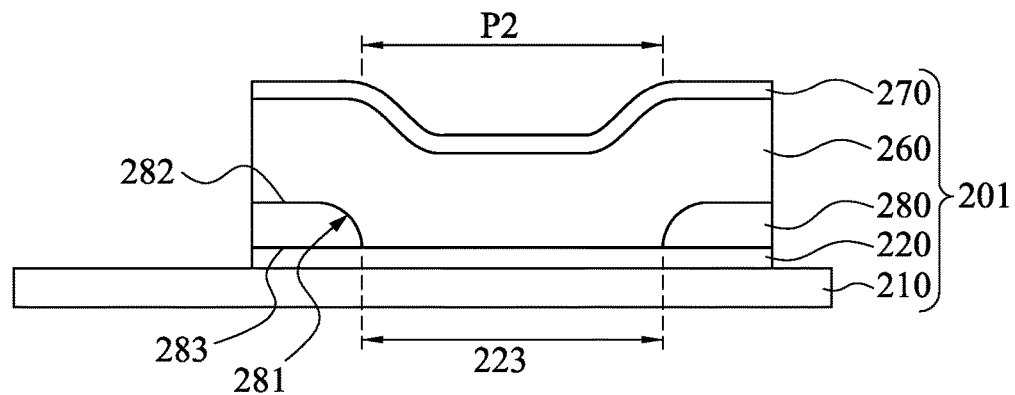
FIG. 3A is a sectional view of an organic electroluminescence component according to another embodiment of the present disclosure.
Figure 3B:
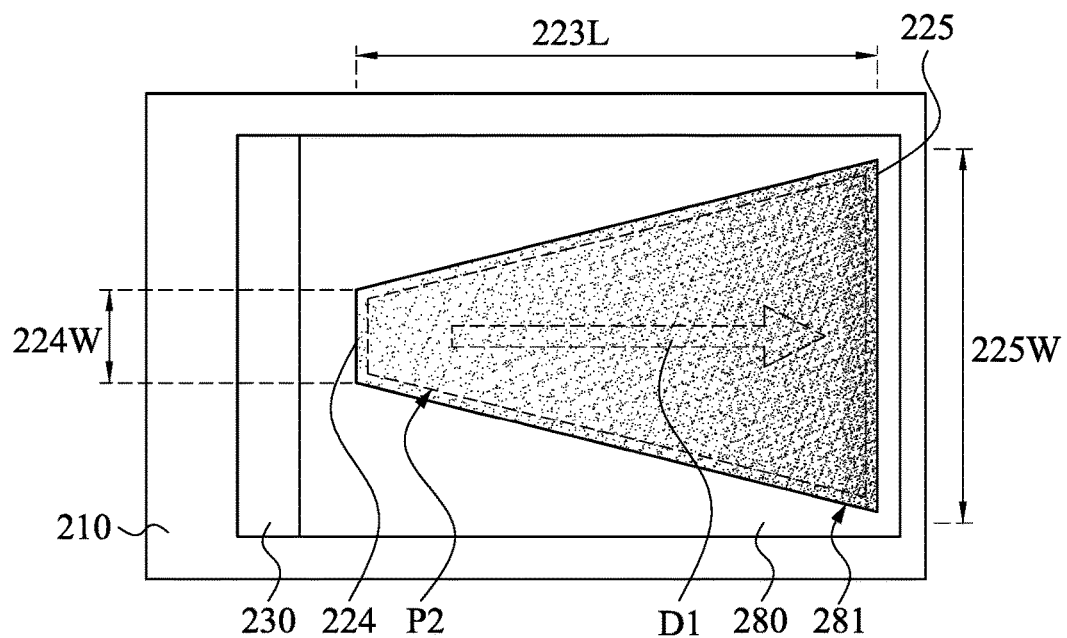
FIG. 3B is a schematic luminescence diagram of an organic electroluminescence component comprising the first electrode layer of FIG. 3A.

FIG. 3A is a sectional view of the organic electroluminescence component 201 according to another embodiment of the present disclosure. FIG. 3B is a schematic luminescence diagram of the organic electroluminescence component 201 comprising the first electrode layer 220. As shown in FIG. 3A and FIG. 3B, the organic electroluminescence component 201 of FIG. 3A and the organic electroluminescence component 200 of FIG. 2A are substantially the same, and the same reference numbers are used for the same parts. The organic electroluminescence component 201 of FIG. 3A differs from the organic electroluminescence component 200 of FIG. 2A in that: the organic electroluminescence component 201 in FIG. 3A further includes an isolation layer 280. The isolation layer 280 is stacked between the organic material layer 260 and the first electrode layer 220. The isolation layer 280 further includes an opening 281. The opening 281 goes through two opposite sides of the isolation layer 280 (such as the upper side 282 and the lower side 283), such that a portion 223 of the first electrode layer 220 is exposed from the upper side 282 of the isolation layer 280 via the opening 281, and a part of the organic material layer 260 is connected to the portion 223 of the first electrode layer 220 via the opening 281. In other words, the first electrode layer 220 completely covers the opening 281 at the lower side 283 of the isolation layer 280, and the portion 223 of the first electrode layer 220 is completely exposed from the opening 281, and connected to the organic material layer 260.

Specifically, in the embodiment, the light-emitting region P2 is defined by the common overlapping region of the second electrode layer 270, the organic material layer 260 and the portion 223 of the first electrode layer 220. Therefore, the shape of the portion 223 of the first electrode layer 220 has the first end 224 and the second end 225, which are opposite to each other and have different impedances. In the embodiment, for example, the width 225W of the second end 225 of the portion 223 of the first electrode layer 220 is twice to 100 times of the width 224W of the first end 224, and the length 223L of the portion 223 of the first electrode layer 220 is 30 mm to 300 mm. However, the above is merely an example and is not intended to be a limitation of the present disclosure.

In addition, in the embodiment, the isolation layer 280 is formed on the first electrode layer 220. For example, the isolation layer 280 can be made of the positive photoresist, the negative photoresist, photosensitive polyimide (PI), silicon oxide, silicon nitride, silicon oxynitride, or other conventional materials.

Thus, since the isolation layer 280 may be formed with a particular pattern on the first electrode layer 220 by using, for example, the photoresist developing process, the shape of the first electrode layer 220 that is exposed is under control, which in turn effectively provides the light-emitting region P2 with a particular shape.

Figure 4:
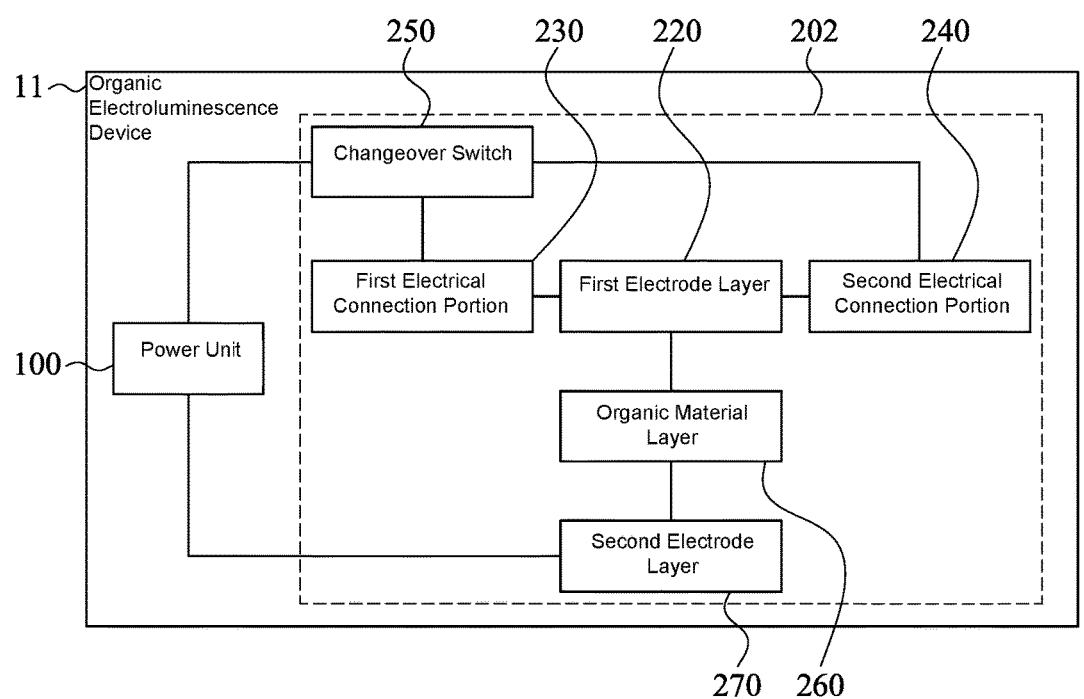
FIG. 4 is an electronic block diagram of an organic electroluminescence device according to another embodiment of the present disclosure.

FIG. 4 is an electronic block diagram of the organic electroluminescence device 11 according to another embodiment of the present disclosure. As shown in FIG. 4, the organic electroluminescence device 11 in FIG. 4 and the organic electroluminescence device 10 in FIG. 1 is substantially the same, and the same reference numbers are used for the same parts. The organic electroluminescence device 11 in FIG. 4 differs from the organic electroluminescence device 10 in FIG. 1 in that: the organic electroluminescence component 202 in FIG. 4 further includes the second electrical connection portion 240 and the changeover switch 250. The second electrical connection portion 240 is electrically connected to the second end 222 of the first electrode layer 220, and located opposite to the first electrical connection portion 230. The changeover switch 250 is electrically connected to the first electrical connection portion 230 and the second electrical connection portion 240, enabling the power unit 100 to selectively switch on the first electrical connection portion 230 and/or the second electrical connection portion 240.

Figure 5A:
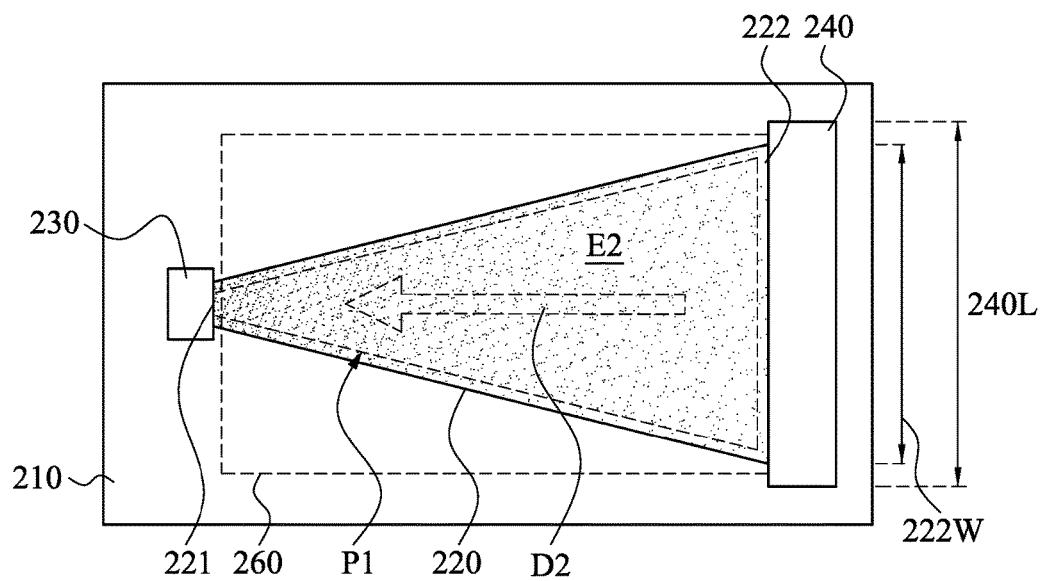
FIG. 5A and FIG. 5B show different schematic luminescence diagrams of an organic electroluminescence component comprising the first electrode layer of FIG. 4.
Figure 5B:
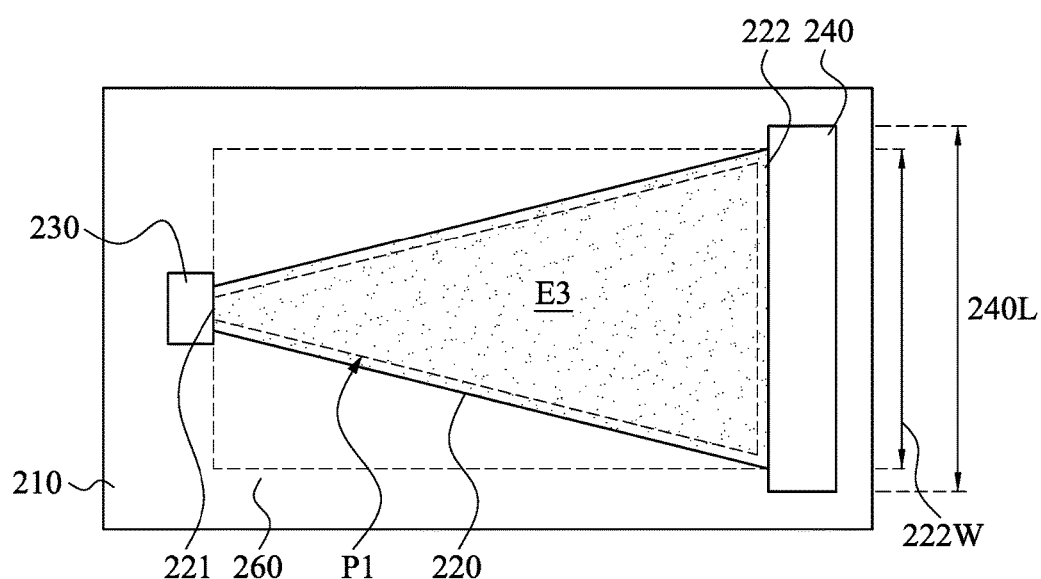

FIG. 5A and FIG. 5B are different schematic luminescence diagrams of organic electroluminescence components 202 comprising the first electrode layer 220, respectively. As shown in FIG. 4 and FIG. 5A, the width 222W of the second end 222 of the first electrode layer 220 is not greater than the length 240L of the second electrical connection portion 240. In the embodiment, for example, the length 240L of the second electrical connection portion 240 is 10 mm to 200 mm. However, the present disclosure is not limited to this range. Under other requirements or limitations, the width of the second end 222 of the first electrode layer 220 may also be equal to the length of the second electrical connection portion 240.

For example, when the changeover switch 250 is switched such that the changeover switch 250 switches on the first electrical connection portion 230 only, once the power unit 100 applies a voltage to the first electrode layer 220 and the second electrode layer 270 (referring to FIG. 2B and FIG. 4), the first gradient-brightness surface E1 will be generated in the light-emitting region P1. The first gradient-brightness surface E1 gradually decreases its brightness step by step in the direction D1 from the first end 221 to the second end 222. For example, the brightness percentage of the aforementioned first gradient-brightness surface E1 ranges from 100% to 10%. However, the above is merely an example and is not intended to be a limitation of the present disclosure.

As shown in FIG. 4 and FIG. 5A, when the changeover switch 250 is switched such that the changeover switch 250 switches on the second electrical connection portion 240 only, once the power unit 100 applies a voltage to the first electrode layer 220 and the second electrode layer 270, the second gradient-brightness surface E2 will be generated in the light-emitting region P1. The second gradient-brightness surface E2 gradually decreases its brightness step by step in the direction D2 from the second end 222 to the first end 221. Compared with the gradient brightness effect of the second gradient-brightness surface E2 in FIG. 5A, the gradient brightness effect of the first gradient-brightness surface E1 in FIG. 2B is more significant. For example, the brightness percentage of the aforementioned gradient-brightness surface ranges from 100% to 50%. However, the above is merely an example and is not intended to be a limitation of the present disclosure.

As shown in FIG. 4 and FIG. 5B, when the changeover switch 250 is switched such that the changeover switch 250 switches on both the first electrical connection portion 230 and the second electrical connection portion 240 at the same time, once the power unit 100 applies a voltage to the first electrode layer 220 and the second electrode layer 270, the uniform-brightness surface E3 will be generated in the light-emitting region P1. The uniform-brightness surface E3 in FIG. 5B is at least better than the first gradient-brightness surface E1 in FIG. 2B and the second gradient-brightness surface E2 in FIG. 5A in terms of brightness uniformity.

In this way, the organic electroluminescence device 11 of the embodiment may control the changeover switch 250 as required or limited, so as to immediately allow the corresponding organic electroluminescence component 202 to provide the first gradient-brightness surface E1, the second gradient-brightness surface E2, or the uniform-brightness surface E3 for improving the flexibility of the product design.

Figure 6:
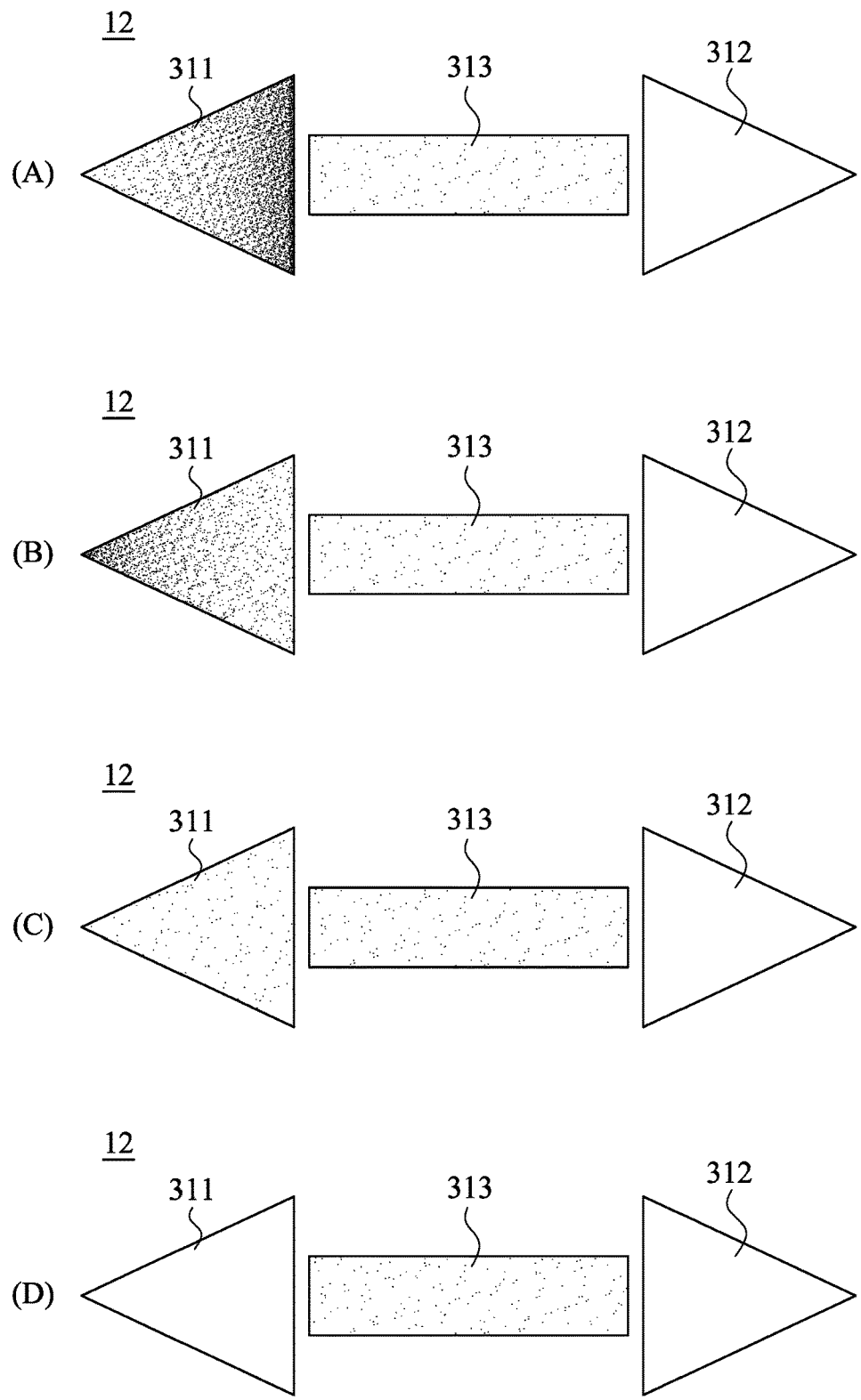
FIG. 6 is a schematic diagram of various luminescence scenarios of an organic electroluminescence device according to another embodiment of the present disclosure.

FIG. 6 is a schematic diagram of various luminescence scenarios of the organic electroluminescence device 12 according to another embodiment of the present disclosure. The organic electroluminescence device 12 of the embodiment is a two-way direction indication lamp. As shown by (A) in FIG. 6, the direction indication lamp has a left arrow 311, a right arrow 312, and a connection section 313 configured thereon. The left arrow 311 and the right arrow 312 are two organic electroluminescence components 202 respectively (see FIG. 4) having light-emitting regions with respective shapes. The connection section 313 is separated from the left arrow 311 and the right arrow 312 and located between the left arrow 311 and the right arrow 312. The connection section 313 is a conventional organic electroluminescence component.

In this way, by switching the changeover switch 250, the light-emitting region of the left arrow 311 is arbitrarily chosen to generate gradient-brightness surfaces in varying directions, so as to accomplish the display effect and purpose of indicating different directions respectively.

For example, as shown by (A) in FIG. 6, the left arrow 311 of the direction indication lamp is taken for example. When the changeover switch 250 controls the current to enter the left arrow 311 only from the left side (i.e., the tip) of the left arrow 311, the gradient-brightness surface generated on the left arrow 311 may gradually decrease its brightness step by step in the direction from the left side (i.e., the tip) to the right arrow 312. Alternatively, as shown by (B) in FIG. 6, when the changeover switch 250 controls the current to enter the left arrow 311 only from the right side (i.e., the long side) of the left arrow 311, the gradient-brightness surface generated on the left arrow 311 gradually decrease its brightness step by step in the direction from the right side (i.e., the long side) to the left side (i.e., the tip). Alternatively, as shown by (C) in FIG. 6, when the changeover switch 250 controls the current to enter the left arrow 311 from both left and right sides of the left arrow 311, the uniform-brightness surface may be generated on the left arrow 311. Alternatively, as shown by (D) in FIG. 6, the changeover switch 250 does not light the left arrow 311.

Further, the changeover switch 250 may be continuously switched to alternately display the left arrows 311 of (A) and (B) of FIG. 6 in succession, so that the brightness of the left arrow 311 has a flow effect, and is more capable of attracting the user's attention for the purpose of indication.

Figure 7:
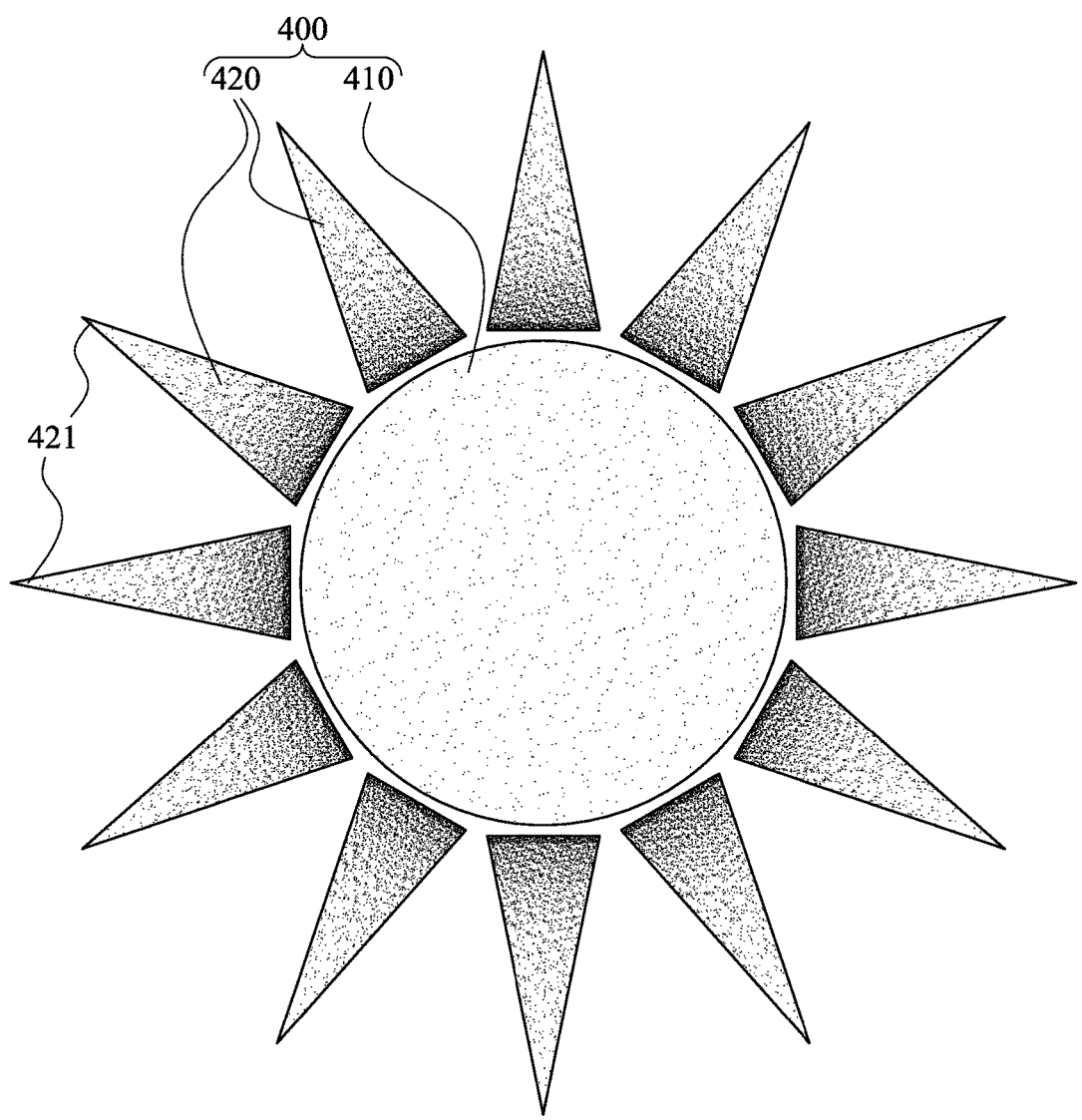
FIG. 7 is a schematic diagram of an organic electroluminescence device according to another embodiment of the present disclosure.

FIG. 7 is a schematic diagram of an organic electroluminescence device 13 according to another embodiment of the present disclosure. As shown in FIG. 7, the organic electroluminescence device 13 in the embodiment is a decorative lamp 400, and the decorative lamp 400 shows a sun image, in which a circle 410 and multiple triangles 420 are configured. The triangles 420 are spaced apart from the circle 410, and the triangles 420 are arranged around the circle 410, and the tips 421 of the triangles 420 are all facing away from the circle 410. Each of the triangles 420 is formed by the organic electroluminescence components 202, and the light emitting regions of the organic electroluminescence components 202 are configured to have the desired shape (FIG. 4). The circle 410 is a conventional organic electroluminescence component.

In this manner, since the power unit 100 can independently control the illumination of the organic electroluminescence components 202, all the triangles 420 may be arbitrarily selected to generate gradient-brightness surfaces with different directions of gradation or uniform-brightness surfaces through the control of the changeover switch 250. Thus, the static sun image and the vivid effect of dynamic solar ray flow may be simultaneously displayed to achieve different display effects.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. An organic electroluminescence component, comprising:
 a substrate;
 a first electrode layer located on the substrate;
 a second electrode layer located on the substrate;
 an organic material layer located between the second electrode layer and the first electrode layer, wherein a common overlapping region of the second electrode layer, the organic material layer and at least one part of the first electrode layer defines a light-emitting region, and the at least one part of the first electrode layer has a shape having a first end and a second end opposite to each other, and the first electrode layer has different impedances at the first end and the second end of the shape, respectively; and
 a first electrical connection portion electrically connected to one end of the first electrode layer, and located opposite to the second end of the shape;
 an isolation layer, wherein the isolation layer is stacked between the organic material layer and the first electrode layer, and the isolation layer is formed with at least one opening, and wherein the at least one part of the first electrode layer is completely exposed from the at least one opening, and wherein the organic material layer is connected to the at least one part of the first electrode layer through the at least one opening;

a second electrical connection portion electrically connected to the other end of the first electrode layer, and located opposite to the first electrical connection portion, wherein a width of the one end where the first electrode layer is electrically connected to the first electrical connection portion is not larger than a length of the first electrical connection portion, and wherein a width of the other end where the first electrode layer is electrically connected to the second electrical connection portion is not larger than a length of the second electrical connection portion; and a changeover switch electrically connected to the first electrical connection portion and the second electrical connection portion to enable a power unit to selectively switch on the first electrical connection portion, the second electrical connection portion, or both of the first electrical connection portion and the second electrical connection portion.

2. The organic electroluminescence component of claim 1, wherein the light-emitting region is defined by a common overlapping region of the second electrode layer, the organic material layer and the entire first electrode layer, and the shape is the entire contour of the first electrode layer.

3. The organic electroluminescence component of claim 1, wherein a width of the first end of the shape is less than a width of the second end.

4. The organic electroluminescence component of claim 1, wherein when the changeover switch only switches on the first electrical connection portion, and the power unit applies a voltage to the first electrode layer and the second electrode layer, an gradient-brightness surface is generated in the light-emitting region, wherein the gradient-brightness surface gradually decreases its brightness step by step in a direction from the first end to the second end, and a brightness percentage of the gradient-brightness surface ranges from 100% to 10%.

5. The organic electroluminescence component of claim 1, wherein when the changeover switch only switches on the second electrical connection portion, and the power unit applies a voltage to the first electrode layer and the second electrode layer, an gradient-brightness surface is generated in the light-emitting region, wherein the gradient-brightness surface gradually decreases its brightness step by step in a direction from the second end to the first end, and a brightness percentage of the gradient-brightness surface ranges from 100% to 50%.

6. The organic electroluminescence component of claim 1, wherein the shape gradually increases its width in a direction from the first end to the second end.

7. The organic electroluminescence component of claim 1, wherein the shape is a triangle, trapezoid, sector, or pentagon.

8. An organic electroluminescence device, comprising:
a power unit; and
at least two organic electroluminescence components, each of the at least two organic electroluminescence components, comprising:
a substrate;
a first electrode layer located on the substrate;
a second electrode layer located on the substrate;
an organic material layer located between the second electrode layer and the first electrode layer, wherein a common overlapping region of the second electrode layer, the organic material layer and at least one part of the first electrode layer defines a light-emitting region, and the at least one part of the first electrode layer has a shape having a first end and a second end opposite to each other, and the first electrode layer has different impedances at the first end and the second end of the shape, respectively; and
a first electrical connection portion electrically connected to one end of the first electrode layer, and located opposite to the second end of the shape of the first electrode layer;
a second electrical connection portion electrically connected to the other end of the first electrode layer, and located opposite to the first electrical connection portion; and
a changeover switch electrically connected to the first electrical connection portion and the second electrical connection portion to enable the power unit to selectively switch on the first electrical connection portion of the organic electroluminescence component, the second electrical connection portion of the organic electroluminescence component, or both of the first electrical connection portion and the second electrical connection portion of the organic electroluminescence component,
wherein the power unit is electrically connected to the changeover switch and the second electrode layer of each of the at least two organic electroluminescence components, so as to independently control the at least two organic electroluminescence components for light emitting.

9. The organic electroluminescence device of claim 8, wherein a gradient-brightness surface and a uniform-brightness surface are respectively generated in the light-emitting regions of each of the at least two organic electroluminescence components.

10. The organic electroluminescence device of claim 8, wherein the organic electroluminescence device is a decorative lamp or a direction indication lamp.

* * * * *